(12) United States Patent
Hashizume

(10) Patent No.: US 7,838,206 B2
(45) Date of Patent: Nov. 23, 2010

(54) SUBSTRATE PROCESSING METHOD AND SUBSTRATE PROCESSING APPARATUS

(75) Inventor: Akio Hashizume, Kyoto (JP)

(73) Assignee: Dainippon Screen MFG. Co., Ltd. (JP)

( * ) Notice: Subject to any disclaimer, the term of this patent is extended or adjusted under 35 U.S.C. 154(b) by 690 days.

(21) Appl. No.: 11/758,389

(22) Filed: Jun. 5, 2007

(65) Prior Publication Data

US 2007/0277856 A1 Dec. 6, 2007

(30) Foreign Application Priority Data

Jun. 5, 2006 (JP) .............................. 2006-156485

(51) Int. Cl.
*G03F 7/26* (2006.01)
(52) U.S. Cl. ................... 430/329; 430/311; 430/331
(58) Field of Classification Search .................. 430/311, 430/331, 329
See application file for complete search history.

(56) References Cited

U.S. PATENT DOCUMENTS

| 5,634,980 A | 6/1997 | Tomita et al. |
| 2004/0000322 A1 | 1/2004 | Verhaverbeke |
| 2005/0205115 A1* | 9/2005 | Okuyama et al. ............. 134/33 |

FOREIGN PATENT DOCUMENTS

| EP | 1 296 358 A2 | 3/2003 |
| JP | 6-291098 | 10/1994 |
| JP | 10-79334 | 3/1998 |

* cited by examiner

*Primary Examiner*—Kathleen Duda
(74) *Attorney, Agent, or Firm*—Ostrolenk Faber LLP

(57) ABSTRACT

A substrate processing method according to the present invention is to be applied for stripping and removing, from the surface of a substrate, a resist no longer required. According to the substrate processing method, a resist stripping liquid is supplied to the center portion of the surface of a substrate held by a substrate holding unit. An organic solvent liquid is supplied to the peripheral edge portion of the surface of the substrate held by the substrate holding unit.

4 Claims, 2 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus applied for removing, from the surface of a substrate, resist no longer required. Examples of the substrate to be processed include a semiconductor wafer, a liquid-crystal-display-device substrate, a plasma-display substrate, an FED (Field Emission Display) substrate, an optical-disk substrate, a magnetic-disk substrate, a photomagnetic-disk substrate, a photomask substrate and the like.

2. Description of Related Art

The processing steps of a semiconductor device include, for example, a step of locally implanting ions, such as phosphorus, arsenic, boron or the like, onto the surface of a semiconductor wafer (hereinafter simply referred to as a wafer).

Prior to the ion implantation step, there is formed, on the surface of a wafer, a resist pattern for masking portions thereof to which ions should not be implanted. The resist pattern is formed by applying a resist on the entire wafer surface to form a resist film thereon and then by selectively removing (through light-exposure and development) the resist film. After the ion implantation step, the resist on the wafer surface becomes unneeded. Therefore, there is executed a processing for removing, from the wafer surface, the resist thus no longer required.

In a typical processing for resist removal, oxygen plasma is irradiated onto the wafer surface to ash the resist thereon. Then, a chemical liquid such as an APM (ammonia-hydrogen peroxide mixture) or the like is supplied onto the wafer surface, thereby to remove the ashed resist, thus achieving the removal of the resist from the wafer surface.

However, the irradiation of oxygen plasma for ashing the resist, results in damage to those portions of the wafer surface not covered with the resist (e.g., oxide film portions exposed from the resist).

Therefore, another method recently becomes the object of public attention. According to this method, the resist ashing is not executed, but an SPM (sulfuric acid/hydrogen peroxide mixture) which is a mixture of a sulfuric acid with a hydrogen peroxide solution is supplied onto the wafer surface to strip and remove the resist by the strong oxidizing force of the peroxomonosulfuric acid ($H_2SO_5$) contained in this SPM.

When the resist is present in the vicinity of the peripheral end face of the wafer, there is a likelihood that the resist in the vicinity of the wafer peripheral end face comes in contact with a hand for wafer delivery to cause the resist to stick to the hand, when the wafer is delivered, thereby to cause a pollution of the wafer. Accordingly, after the resist film has been formed on the wafer surface, a rinse liquid is supplied to the vicinity of the peripheral end face of the resist film to flush away the resist film in the vicinity of the wafer peripheral end face. Therefore, as shown in FIG. 3, the resist on the wafer peripheral edge portion is so inclined as to be reduced in thickness in the direction nearer to the wafer peripheral edge.

Accordingly, when a high-dose ion implantation is conducted, the resist at the center portion of the wafer is hardened only at the surface thereof, while the resist at the peripheral edge portion of the wafer is hardened in its entire thickness at its portion having a reduced thickness, as shown by the broken line in FIG. 3. Moreover, in the positive-type resist, for simplification of the production process, the wafer peripheral edge portion (non-device forming region) is not exposed to light and the resist on the wafer peripheral edge portion is therefore not patterned. As a result, the SPM enters the gaps in the resist pattern at the wafer center portion, so that the hardened layer formed on the surface can be stripped together with the resist which is below the hardened layer and not hardened. At the wafer peripheral edge portion, however, the resist has no gaps into which the SPM enters, and the SPM therefore does not penetrate the resist. This disadvantageously prevents the hardened resist from being removed. In particular, when the ions to be implanted into the wafer are arsenic ions, the resist is hardened considerably, thereby further making it difficult to remove the resist.

SUMMARY OF THE INVENTION

It is an object of the present invention to provide a substrate processing method and a substrate processing apparatus capable of removing a hardened resist even though the resist at the peripheral edge portion of the surface of a substrate is hardened in its entire thickness.

A substrate processing method according to the present invention is to be applied for striping and removing, from the surface of a substrate, resist no longer required. This substrate processing method comprises: a substrate holding step of holding a substrate by a substrate holding unit; a resist striping liquid supplying step of supplying a resist striping liquid to the center portion of the surface of the substrate held by the substrate holding unit; and an organic solvent supplying step of supplying an organic solvent liquid to the peripheral edge portion of the surface of the substrate held by the substrate holding unit.

According to the method above-mentioned, the resist striping liquid is supplied to the center portion of the surface of a substrate, and the organic solvent liquid is supplied to the peripheral edge portion of the surface of the substrate. Accordingly, the resist on the surface of the substrate can be stripped and removed, and the resist on the peripheral edge portion of the surface of the substrate, even hardened in its entire thickness, can be removed after dissolved by the organic solvent liquid.

As the organic solvent, there may be used a solvent capable of dissolving the resist hardened by ion implantation, for example, IPA (isopropyl alcohol), NMP (N-methyl-2-pyrolidone), acetone, cyclohexanone, and EC (ethylene carbonate).

The peripheral edge portion refers to a non-device-forming region on the surface of a substrate on which no devices are formed.

Preferably, the substrate processing method further comprises a protective fluid supplying step of supplying a protective fluid which protects the center portion of the substrate surface from the organic solvent to the center portion of the surface of the substrate held by the substrate holding unit, simultaneously with the organic solvent supplying step. In this case, the protective fluid is supplied to the center portion of the surface of the substrate (the substrate surface), simultaneously with the supply of the organic solvent liquid to the peripheral edge portion of the substrate surface. Accordingly, the center portion of the substrate surface is protected as covered with the protective fluid. This prevents the organic solvent from attaching to the center portion of the substrate surface. Thus, the center portion of the substrate surface is prevented from being contaminated due to attachment of a component of the organic solvent thereto.

The center portion refers to a device-forming region of a substrate surface on which the devices are formed.

The protective fluid may be a striping fluid capable of striping and removing the resist at the center portion of the substrate surface. In this case, during the supply of the organic solvent to the peripheral edge portion of the substrate surface, the resist striping processing can simultaneously be executed to the center portion of the substrate surface with the use of the striping fluid such as SPM, and SOM (Sulfuric acid Ozone Mixture) while the center portion can be protected.

The resist striping liquid supplying step may be executed simultaneously with the organic solvent supplying step. In this case, the resist striping liquid may be used as the striping fluid. According to this, the resist striping liquid supplying step can be combined with the protective fluid supplying step. Thus, the resist striping processing can be continued with the use of the same resist striping liquid, thereby enabling the resist striping processing at the center portion of the substrate can uniformly and efficiently to be executed.

The protective fluid may be a fluid having no ability to strip and remove the resist at the center portion of the substrate surface. In this case, with the use of a liquid or gas having no ability to strip and remove the resist at the center portion of the substrate surface, the center portion of the substrate surface can be protected from the organic solvent.

A substrate processing apparatus according to the present invention comprises: a substrate holding unit for holding a substrate; a resist striping liquid nozzle for supplying a resist striping liquid to the center portion of the substrate surface held by the substrate holding unit; and an organic solvent nozzle for supplying an organic solvent liquid to the peripheral edge portion of the substrate surface held by the substrate holding unit.

According to the arrangement, by supplying the resist striping liquid to the center portion of the substrate surface, the resist on the center portion can be stripped and removed.

Further, while the resist striping liquid is supplied to the center portion of the substrate surface, the organic solvent liquid can be supplied to the peripheral edge portion of the substrate surface. Accordingly, the resist on the peripheral edge portion of the substrate surface, even hardened in its entire thickness, can be removed as dissolved by the organic solvent. Further, during the supply of the organic solvent to the peripheral edge portion of the substrate surface, the resist striping processing can simultaneously be executed to the center portion of the substrate surface by the resist striping liquid with the center portion protected.

The foregoing and other objects, features and effects of the present invention will become more apparent from the following detailed description of the preferred embodiments with reference to the attached drawings.

DETAILED DESCRIPTION OF PREFERRED EMBODIMENTS

The following description will discuss an embodiment of the present invention with reference to the attached drawings.

Figure 1:
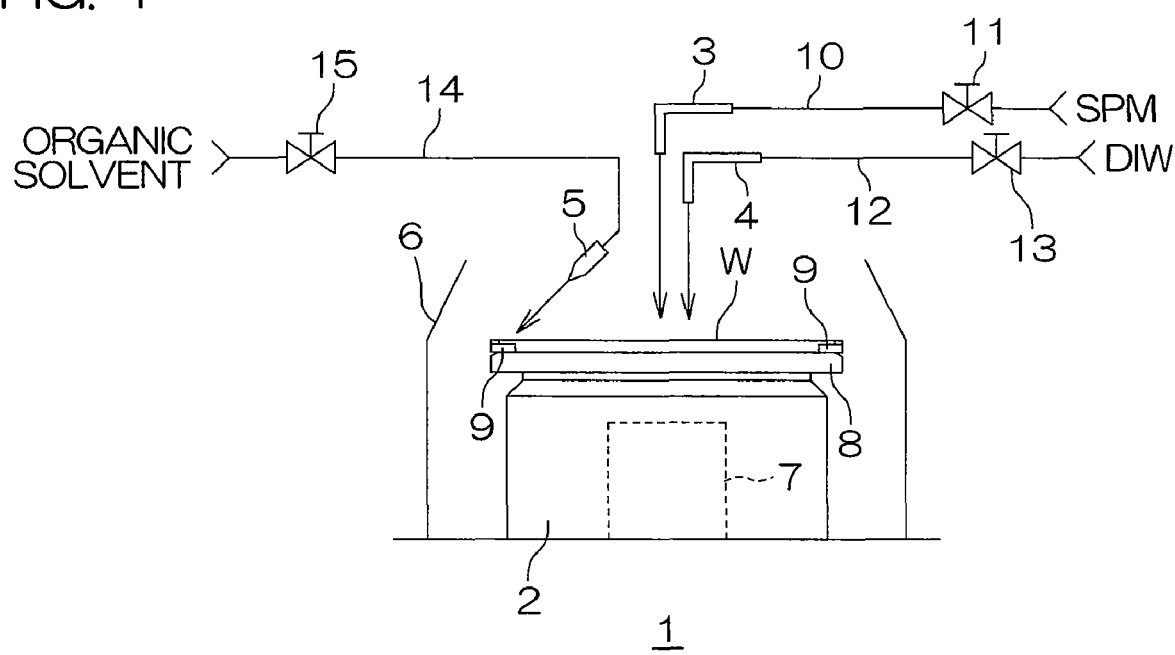
FIG. 1 is a view illustrating the arrangement of a substrate processing apparatus according to an embodiment of the present invention.

FIG. 1 is a view illustrating the arrangement of a substrate processing apparatus according to an embodiment of the present invention.

A substrate processing apparatus 1 is a sheet-feed type apparatus. The substrate processing apparatus 1 can suitably be used in a processing in which resist portions no longer required are removed from the surface of a as an example of a substrate after implanting ions (e.g., phosphorus, arsenic, boron etc.) onto the surface of a wafer W. The substrate processing apparatus 1 comprises: a spin chuck 2 for generally horizontally holding and rotating the wafer W; an SPM nozzle 3 for supplying an SPM as a resist striping liquid to the center portion of the surface of the wafer W held by the spin chuck 2; a DIW nozzle 4 for supplying DIW (deionized water) onto the center portion of the surface of the wafer W held by the spin chuck 2; an organic solvent nozzle 5 for supplying an organic solvent liquid to the peripheral edge portion of the surface of the wafer W held by the spin chuck 2; and a cup 6 for receiving SPM or DIW which flows down or scatters from the wafer W. The cup 6 surrounds the spin chuck 2.

The spin chuck 2 comprises: a motor 7; a disk-like spin base 8 to be rotated around its vertical axis by the rotational driving force of the motor 7; and a plurality of holding members 9 disposed at the peripheral edge portion of the spin base 8 generally at equiangular intervals for holding the wafer W generally horizontally. With the wafer W held by the plurality of holding members 9, the spin base 8 is rotated by the rotational driving force of the motor 7. This causes the wafer W to be rotated, while maintained generally horizontally, around the vertical axis together with the spin base 8.

The spin chuck 2 is not limited to one having such a structure, but a vacuum chuck of vacuum suction type may be used instead. The vacuum chuck is arranged to vacuum suction the underside (non-device surface) of the wafer W, and holds the wafer W horizontally. Then, when the vacuum chuck in this state is rotated around the vertical axis, the wafer W held can be rotated.

The SPM nozzle 3 is disposed above the spin chuck 2 such that its discharge port is directed to the vicinity of the rotational center of the wafer W. The SPM nozzle 3 is connected to an SPM supply tube 10. The SPM supply tube 10 is supplied with an SPM having a high temperature raised to about 100° C. or more at which the resist on the surface of the wafer W can satisfactorily be stripped. An SPM at such a high temperature is formed, for example, by supplying a sulfuric acid and a hydrogen peroxide solution to a mixing valve (not shown) connected to the SPM supply tube 10 and by mixing this mixture in the mixing valve. The SPM thus formed is then supplied to the SPM supply tube 10. SPM valve 11 for controlling the supply of the SPM to the SPM nozzle 3 is disposed in the midway of the SPM supply tube 10.

Agitating unit for agitating the sulfuric acid and the hydrogen peroxide solution in the SPM supply tube 10 may be disposed in the midway of the SPM supply tube 10 leading to the SPM valve 11 from the mixing valve. For example, for this agitating unit, an agitating-fin-equipped flow tube can be used which has a plurality of agitating fins each formed by a rectangular plate-like member twisted generally by 180 degrees in the liquid flowing direction. These agitating fins are disposed so that their rotational angles are alternately different by 90 degrees around the tube center axis along the liquid flowing direction. As the agitating-fin-equipped flow tube, for example, "MX series: Inline Mixer" manufactured by Noritake Co., Limited and Advance Electric Co., Inc. can be used. By sufficiently agitating the mixture of a sulfuric acid and a hydrogen peroxide solution with this agitating unit, an SPM solution containing $H_2SO_5$ having a much stronger oxidizability is produced.

The DIW nozzle 4 is disposed above the spin chuck 2 such that its discharge port is directed to the vicinity of the rotational center of the wafer W. A DIW supply tube 12 is connected to the DIW nozzle 4. DIW from a DIW supply source is supplied to the DIW nozzle 4 through the DIW supply tube 12. DIW valve 13 for controlling the supply of the DIW to the DIW nozzle 4 is disposed in the midway of the DIW supply tube 12.

The organic solvent nozzle 5 is disposed above the spin chuck 2 with its discharge port obliquely downwardly inclined so that the organic solvent liquid is supplied to the peripheral edge portion of the wafer W from an obliquely upward position on a side of the rotational axis of the wafer W. An organic solvent supply tube 14 is connected to the organic solvent nozzle 5. An organic solvent liquid from the organic solvent supply source is supplied to the organic solvent nozzle 5 through the organic solvent supply tube 14. An organic solvent valve 15 for controlling the supply of the organic solvent liquid to the organic solvent nozzle 5 is disposed in the midway of the organic solvent supply tube 14.

As the organic solvent, a solvent capable of dissolving the resist hardened by ion implantation, for example, IPA (isopropyl alcohol), NMP (N-methyl-2-pyrolidone), acetone, cyclohexanone, and EC (ethylene carbonate) can be used.

Figure 2:
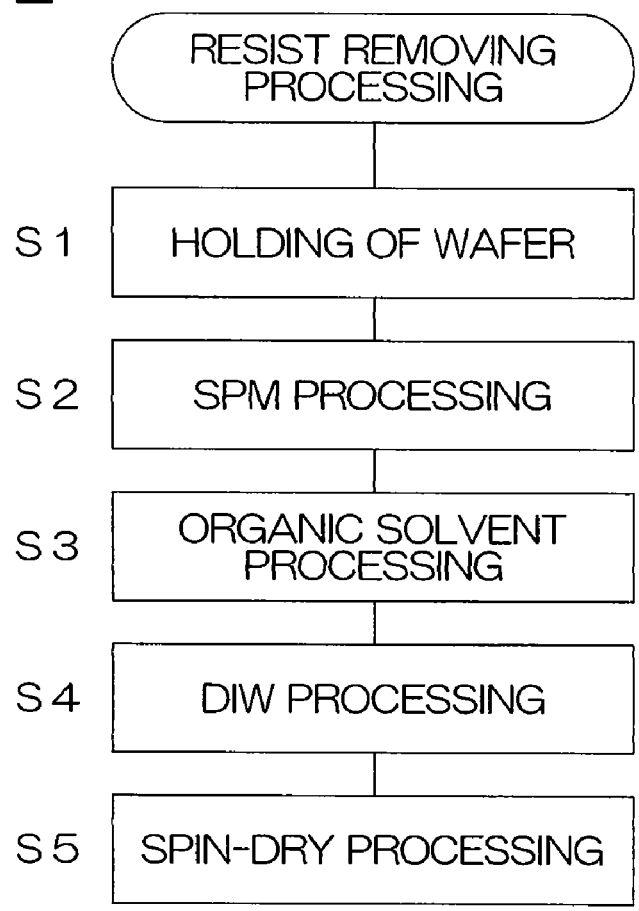
FIG. 2 is a view illustrating a resist removing processing in the substrate processing apparatus shown in FIG. 1.
Figure 3:
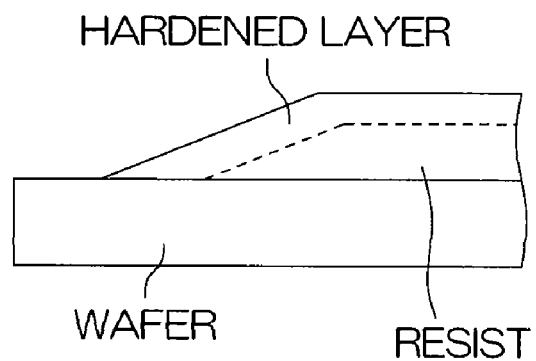
FIG. 3 is a side view illustrating the state of a resist on the peripheral edge portion of the surface of a wafer.

FIG. 2 is a view illustrating a resist removing processing in the substrate processing apparatus shown in FIG. 1.

At the time of the resist removing processing, a wafer W is carried in by a delivery robot (not shown). This wafer W has not been subjected to a processing of ashing the resist and has, on the surface thereof, the resist having a hardened layer as altered by ion implantation.

The wafer W carried in by the delivery robot is held by the spin chuck 2 with the surface thereof turned up (S1: Holding of wafer).

When the wafer W is held by the spin chuck 2, the motor 7 is driven to cause the wafer W to start rotating. Then, the SPM valve 11 is opened to supply the SPM from the SPM nozzle 3 to the vicinity of the rotational center of the surface of the wafer W (S2: SPM processing). The SPM supplied onto the surface of the wafer W flows on the surface of the wafer W from its center portion toward its peripheral edge due to a centrifugal force produced by the rotation of the wafer W. This causes the SPM to be spread on the entire surface of the wafer W. At the center portion (device-forming region) of the surface of the wafer W, the SPM enters the gaps in the resist pattern, and the resist is stripped (lifted off) and removed together with the hardened layer formed on the surface thereof.

After the passage of a predetermined period of time (e.g., one second or more) from the start of the SPM processing, the organic solvent valve 15 is opened to supply the organic solvent liquid to the peripheral edge portion (non-device forming region) of the surface of the wafer W (S3: Organic solvent processing), while the supply of the SPM to the center portion of the surface of the wafer W is continued. The organic solvent liquid supplied onto the surface of the wafer W flows from the supply position toward the peripheral edge of the wafer W due to a centrifugal force produced by the rotation of the wafer W. Accordingly, even if hardened in its entire thickness, the resist on the peripheral edge portion of the surface of the wafer W is dissolved by the organic solvent liquid and removed. At this time, the center portion of the surface of the wafer W is covered with the SPM. Therefore, the resist lift-off by the SPM further progresses.

During the SPM processing and the organic solvent processing, the rotational speed of the wafer W may be maintained at a fixed speed in the range of 30 to 1500 rpm, or may be changed, within this range, dependent on the elapsed time.

After the passage of a predetermined period of time from the start of the organic solvent processing, the SPM valve 11 and the organic solvent valve 15 are closed to stop the supply of each of the SPM and the organic solvent to the surface of the wafer W. Further, the rotational speed of the wafer W is controlled to a predetermined speed in the range of 300 to 1000 rpm. Then, the DIW valve 13 is opened to supply the DIW to the vicinity of the rotational center of the surface of the wafer W from the DIW nozzle 4 (S4: DIW processing). The DIW supplied to the surface of the wafer W flows on the surface of the wafer W from its center portion toward its peripheral edge due to a centrifugal force produced by the rotation of the wafer W. This causes the DIW to be spread on the entire surface of the wafer W, so that the SPM and the organic solvent on the surface of the wafer W are flushed away by the DIW.

After the passage of a predetermined period of time from the start of the DIW processing, the DIW valve 13 is closed to stop the supply of the DIW to the surface of the wafer W. Thereafter, with the rotational speed of the wafer W increased to a predetermined speed in the range of 2500 to 5000 rpm, the DIW attached to the wafer W is spun off to dry the wafer W (S5: Spin-dry processing). When this spin-dry processing is executed for a predetermined period of time, the drive of the motor 7 is stopped to stop the rotation of the wafer W. Then the wafer W is carried out by the delivery robot.

As discussed in the foregoing, by supplying the SPM to the center portion of the surface of the wafer W, the resist on the center portion of the surface of the wafer W can be stripped and removed. Further, the organic solvent liquid is supplied to the peripheral edge portion of the surface of the wafer W, so that even when the resist on the peripheral edge portion of the surface of the wafer W is hardened in its entire thickness, the hardened resist can be dissolved by the organic solvent and removed. Thus, the resist can satisfactorily be removed from the entire surface of the wafer W.

In this embodiment, the SPM as a protective fluid is supplied to the center portion of the surface of the wafer W simultaneously with the supply of the organic solvent liquid to the peripheral edge portion of the surface of the wafer W. Accordingly, the center portion of the surface of the wafer W is covered and protected with the SPM while the organic solvent liquid is supplied to the peripheral edge portion of the surface of the wafer W. This can prevent the organic solvent from attaching to the center portion of the surface of the wafer W, and therefore, prevents the center portion of the surface of the wafer W from being contaminated due to attachment of a component of the organic solvent thereto (contamination by organic matter). Further, since the center portion of the surface of the wafer W is covered with the SPM, the resist striping processing by the SPM can simultaneously be executed on the center portion of the surface of the wafer W.

Simultaneously with the supply of the organic solvent liquid to the peripheral edge portion of the surface of the wafer W, a fluid other than the SPM may be supplied as the protective fluid to the center portion of the surface of the wafer W. For example, as the protective fluid, an SOM as a fluid capable of striping and removing the resist as in the case of the SPM may be supplied. Further, as the protective fluid, for example, a fluid having no ability to strip and remove the resist may be supplied. As the fluid of this type, DIW may be supplied, or a functional water such as carbonated water, ionized water, ozone water, regenerated water (hydrogen water) or magnetic water may be supplied, or an inert gas such as nitrogen gas may be supplied.

Although an embodiment of the present invention has been discussed in the foregoing, the present invention may be embodied in other forms. For example, the SPM processing (S2) and the organic solvent processing (S3) may be reversed in the step sequence. More specifically, the SPM processing of only supplying the SPM to the center portion of the surface of the wafer W may be executed, after the organic solvent processing of supplying the SPM to the center portion of the surface of the wafer W simultaneously with the supply of the organic solvent liquid to the peripheral portion of the surface of the wafer W.

Further, when in the organic solvent processing (S3), a fluid capable of striping and removing the resist is supplied as the protective fluid to the center portion of the surface of the wafer W and the whole resist on the center portion of the surface of the wafer W can be removed by the supply of the fluid, the SPM processing (S2) before or after the organic solvent processing (S3) may be omitted.

Further, instead of the resist striping SPM processing (S2) to be executed before or after the organic solvent processing (S3), an SOM may be supplied as the resist striping liquid to the center portion of the surface of the wafer W to strip and remove the resist at the center portion.

Further, a so-called scan nozzle may be adopted in which the organic solvent nozzle 5 is attached, above the spin chuck 2, to an arm swingable in a horizontal plane, and in which the width of supply of the organic solvent liquid onto the surface of the wafer W can be changed by swinging the arm.

These embodiments of the present invention are mere specific examples only for clarifying the technical contents of the present invention. Therefore, the present invention should not be construed as limited to these specific examples. The spirit and scope of the present invention are limited only by the appended claims.

This Application corresponds to Japanese Patent Application No. 2006-156485 filed with the Japanese Patent Office on 5 Jun. 2006, the full disclosure of which is incorporated herein by reference.

What is claimed is:

1. A substrate processing method to be applied for stripping and removing a resist no longer required from a surface of a substrate, comprising:
   a substrate holding step of holding the substrate by a substrate holding unit;
   a resist stripping liquid supplying step of supplying a resist stripping liquid to a center portion of the surface of the substrate held by the substrate holding unit;
   an organic solvent supplying step of supplying an organic solvent liquid to a peripheral edge portion of the surface of the substrate held by the substrate holding unit; and
   further comprising a protective fluid supplying step of supplying a protective fluid which protects the center portion from the organic solvent to the center portion of the surface of the substrate held by the substrate holding unit, simultaneously with the organic solvent supplying step.

2. A substrate processing method according to claim 1, wherein the protective fluid is a stripping fluid capable of stripping and removing a resist at the center portion of the surface of the substrate.

3. A substrate processing method according to claim 2, wherein the resist stripping liquid supplying step is executed simultaneously with the organic solvent supplying step, and the resist stripping liquid is used as the stripping fluid.

4. A substrate processing method according to claim 1, wherein the protective fluid is a fluid having no ability to strip and remove a resist at the center portion of the surface of the substrate.

* * * * *